(12) United States Patent
Puri et al.

(10) Patent No.: US 8,751,985 B1
(45) Date of Patent: Jun. 10, 2014

(54) HIERARCHICAL LAYOUT VERSUS SCHEMATIC (LVS) COMPARISON WITH EXTRANEOUS DEVICE ELIMINATION

(71) Applicant: Globalfoundries Inc., Grand Cayman, KY (US)

(72) Inventors: Sandeep Puri, Malta, NY (US); Bipul C. Paul, Clifton Park, NY (US); Werner Juengling, Saratoga Springs, NY (US); Anurag Mittal, Wappinger Falls, NY (US)

(73) Assignee: Globalfoundries Inc., Santa Clara, CA (US)

( * ) Notice: Subject to any disclaimer, the term of this patent is extended or adjusted under 35 U.S.C. 154(b) by 0 days.

(21) Appl. No.: 13/795,198

(22) Filed: Mar. 12, 2013

(51) Int. Cl.
*G06F 17/50* (2006.01)

(52) U.S. Cl.
USPC .......................................... 716/106

(58) Field of Classification Search
USPC .......................................... 716/106
See application file for complete search history.

(56) References Cited

U.S. PATENT DOCUMENTS

| | | | |
|---|---|---|---|
| 6,415,421 B2 * | 7/2002 | Anderson et al. | 716/52 |
| 6,418,551 B1 * | 7/2002 | McKay et al. | 716/112 |
| 6,425,113 B1 * | 7/2002 | Anderson et al. | 716/52 |
| 6,499,130 B1 | 12/2002 | Lipton et al. | |
| 6,505,323 B1 | 1/2003 | Lipton et al. | |
| 6,799,307 B1 | 9/2004 | Lipton et al. | |
| 6,988,253 B1 | 1/2006 | Lipton et al. | |
| 7,139,990 B2 | 11/2006 | Singh et al. | |
| 7,412,676 B2 * | 8/2008 | Cobb et al. | 716/106 |
| 7,480,878 B2 | 1/2009 | Holesovsky et al. | |
| 2002/0100005 A1 * | 7/2002 | Anderson et al. | 716/5 |
| 2005/0216873 A1 * | 9/2005 | Singh et al. | 716/5 |
| 2008/0256500 A1 * | 10/2008 | Cobb et al. | 716/5 |
| 2013/0198703 A1 * | 8/2013 | Lu et al. | 716/107 |

* cited by examiner

*Primary Examiner* — Suchin Parihar
(74) *Attorney, Agent, or Firm* — Steven Wernicki, Esq.; Matthew M. Hulihan, Esq.; Heslin Rothenberg Farley & Mesiti P.C.

(57) ABSTRACT

Hierarchical layout versus schematic comparison with extraneous device elimination is provided. This includes obtaining a hierarchical layout netlist for a circuit design, the hierarchical layout netlist grouping arrayed devices of the circuit design into blocks repeated at a top level of a hierarchy of the hierarchical layout netlist. A modified hierarchical layout netlist defining active devices and connections thereof to top level pads of the circuit design is generated, in which extraneous devices are selectively removed from the obtained hierarchical layout netlist. The modified hierarchical layout netlist is verified against an input schematic netlist defining active devices of the circuit design and connections thereof to pads of the circuit design.

16 Claims, 9 Drawing Sheets

```
.subckt Block 1 2 4 5 6 7 8 10
m94959 25878 25660 66502 8      nfet w=9e-08 l=3.8e-08  ⎫
m94960 66503 25661 25879 8      nfet w=9e-08 l=3.8e-08  ⎪
m94970 4      1     25889 8     nfet w=9e-08 l=3.8e-08  ⎬ 602
m94971 25890 2      4     8     nfet w=9e-08 l=3.8e-08  ⎭
.
.
.
.ends .subckt topcircuit pad_01 pad_02 pad_03 pad_04 pad_05 pad_06 pad_07 pad_08  ⎫
+ pad_09 pad_15 pad_16 pad_17 pad_18 pad_19 pad_20 pad_21 pad_22 pad_23 pad_24 pad_25  ⎬ 604
x0 pad_22 pad_19 pad_16 pad_13 pad_10 pad_07 pad_04 pad_01 Block  ⎭
x1 pad_23 pad_20 pad_17 pad_14 pad_11 pad_08 pad_05 pad_02 Block
x2 pad_24 pad_21 pad_18 pad_15 pad_12 pad_09 pad_05 pad_03 Block
.
.
.
.ends
```

FIG. 6

```
.subckt Block 1 2 4 5 6 7 8 10                                              ← 602a
********** m94959 25878 25660 66502 8    nfet w=9e-08 l=3.8e-08  ⎫
********** m94960 66503 25661 25879 8    nfet w=9e-08 l=3.8e-08  ⎪
           m94970 4      1     25889 8   nfet w=9e-08 l=3.8e-08  ⎬ 602      ← 602b
           m94971 25890 2      4     8   nfet w=9e-08 l=3.8e-08  ⎭          ← 602c
.
.ends                                                                       ← 602d .subckt topcircuit pad_01 pad_02 pad_03 pad_04 pad_05 pad_06 pad_07 pad_08
+ pad_09 pad_15 pad_16 pad_17 pad_18 pad_19 pad_20 pad_21 pad_22 pad_23 pad_24 pad_25
x0 pad_22 pad_19 pad_16 pad_13 pad_10 pad_07 pad_04 pad_01 Block
x1 pad_23 pad_20 pad_17 pad_14 pad_11 pad_08 pad_05 pad_02 Block
x2 pad_24 pad_21 pad_18 pad_15 pad_12 pad_09 pad_05 pad_03 Block
.
.ends
```

HIERARCHICAL LAYOUT VERSUS SCHEMATIC (LVS) COMPARISON WITH EXTRANEOUS DEVICE ELIMINATION

BACKGROUND OF THE INVENTION

In the fabrication of an integrated circuit, physical verification of the circuit layout is an important process, and is particularly vital during the early stages of technology development in which circuits intended for technology ramp-up and device modeling are produced. Layout versus schematic (LVS) comparison is a well-known computerized verification method for determining whether a netlist generated from a circuit layout corresponds to an input schematic diagram/ design for the intended circuit. However, LVS techniques are not always efficient, especially when dealing with circuit layouts with large arrays of devices. In those cases, manual processes can be performed to verify a circuit layout, but manual verification introduces its own disadvantages. What is needed is an efficient automated verification technique for verifying circuit layouts having arrays of potentially millions of devices.

BRIEF SUMMARY

The shortcomings of the prior art are overcome and additional advantages are provided through the provision of a method which includes, for instance, facilitating hierarchy-based layout versus schematic verification, the including comprising: obtaining a hierarchical layout netlist for a circuit design, wherein the hierarchical layout netlist groups arrayed devices of the circuit design into a plurality of blocks repeated at a top level of a hierarchy of the hierarchical layout netlist; generating, by a processor, a modified hierarchical layout netlist defining active devices and connections thereof to top level pads of the circuit design, the generating including selectively removing extraneous devices from the obtained hierarchical layout netlist; and verifying the modified hierarchical layout netlist against an input schematic netlist defining active devices of the circuit design and connections thereof to pads of the circuit design.

In a further aspect, a computer system is provided which includes a storage device including program instructions; and a processor configured to execute the program instructions to perform a method, which includes, for instance: facilitating hierarchy-based layout versus schematic verification, the facilitating including: obtaining a hierarchical layout netlist for a circuit design, wherein the hierarchical layout netlist groups arrayed devices of the circuit design into a plurality of blocks repeated at a top level of a hierarchy of the hierarchical layout netlist; generating a modified hierarchical layout netlist defining active devices and connections thereof to top level pads of the circuit design, the generating including selectively removing extraneous devices from the obtained hierarchical layout netlist; and verifying the modified hierarchical layout netlist against an input schematic netlist defining active devices of the circuit design and connections thereof to pads of the circuit design.

In yet a further aspect, a computer program product is provided which includes a tangible storage medium storing program instructions readable by a processor for execution to perform a method which includes, for instance, facilitating hierarchy-based layout versus schematic verification. The facilitating includes: obtaining a hierarchical layout netlist for a circuit design, wherein the hierarchical layout netlist groups arrayed devices of the circuit design into a plurality of blocks repeated at a top level of a hierarchy of the hierarchical layout netlist; generating a modified hierarchical layout netlist defining active devices and connections thereof to top level pads of the circuit design, the generating including selectively removing extraneous devices from the obtained hierarchical layout netlist; and verifying the modified hierarchical layout netlist against an input schematic netlist defining active devices of the circuit design and connections thereof to pads of the circuit design.

Additional features and advantages are realized through the concepts of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Described herein is a layout versus schematic (LVS) comparison technique especially advantageous for large circuit layouts containing repetitive arrays having large numbers of total devices, and having a high ratio of 'dummy vs. 'active' devices. Active devices are those devices targeted for measurement and characterization. Dummy devices (also referred to herein as extraneous devices) are devices other than the active devices, such a floating/partially-floating devices, devices placed for density fill purposes, or non-floating devices which are not electrically significant within the circuit, as examples. The presence of large a number of dummy devices makes conventional layout versus schematic (LVS) comparison impractical, and almost impossible in some cases where the number of total devices present in the layout far exceeds the number of devices that actually need to be electrically measured and characterized. Aspects described herein provide solutions for verifying circuit layouts, including those in which there are potentially multiple millions of arrayed devices, wherein only a relative few (perhaps as few as five or ten) actually need to be verified and tested. It is not uncommon in circuit design for only a handful of potentially millions of cells to be requiring of testing.

In LVS comparison, a circuit layout is input to an Electric Design Automation (EDA) package. A module thereof extracts from the layout a netlist (typically a Simulation Program with Integrated Circuit Emphasis (SPICE) compatible circuit netlist). Another module then compares this extracted netlist against an equivalent schematic for verification. Example EDA packages include ASSURA® and DRACULA® (offered by Cadence Design Systems, San Jose, Calif., USA), HERCULES LVS (offered by Synopsis, Inc., Mountain View, Calif., USA), and the Calibre® line of software (offer by Mentor Graphics Corporation, Wilsonville, Oreg., USA). An example layout/schematic type is the Graphic Database System II (.gds2) file format.

Conventional methodologies do not always achieve the necessary LVS verification in an efficient manner, for instance when only a few critical modules/parts/devices of a chip layout require independent measurements and characterizations, while the number of dummy/unused devices far out-number the number of critical devices. Additionally, standard EDA packages are typically designed to extract the SPICE netlist of the entire chip layout, without actively identifying the devices/circuits/modules of interest. It therefore becomes difficult or impractical to achieve LVS comparison when the layout netlist contains hundreds of thousands or more unused devices. Further, though some tools contain options to disregard or ignore devices under certain conditions of device connections or floating terminals, as examples, these conditions do not encompass every criterion by which a user may wish to define a dummy/unused device.

In light of existing limitations, a manual review (e.g. by a person) is carried out in many cases where LVS cannot be performed for large arrays. However, manual review is burdensome, time consuming, and subject to human error. In addition, as semiconductor device technology scales down below 32 nm to 28 nm, 20 nm, and so forth, the ever-increasing cost of supplies and resources, such as masks, wafers, and testing resources, leaves little room for errors at any steps of the circuit design process. This potential for significant additional cost is compounded when working with circuits meant for testing and modeling devices, as the impact on time-to-market on the final products can be considerable in case of a mistake during a manual review verification process.

Figure 1:
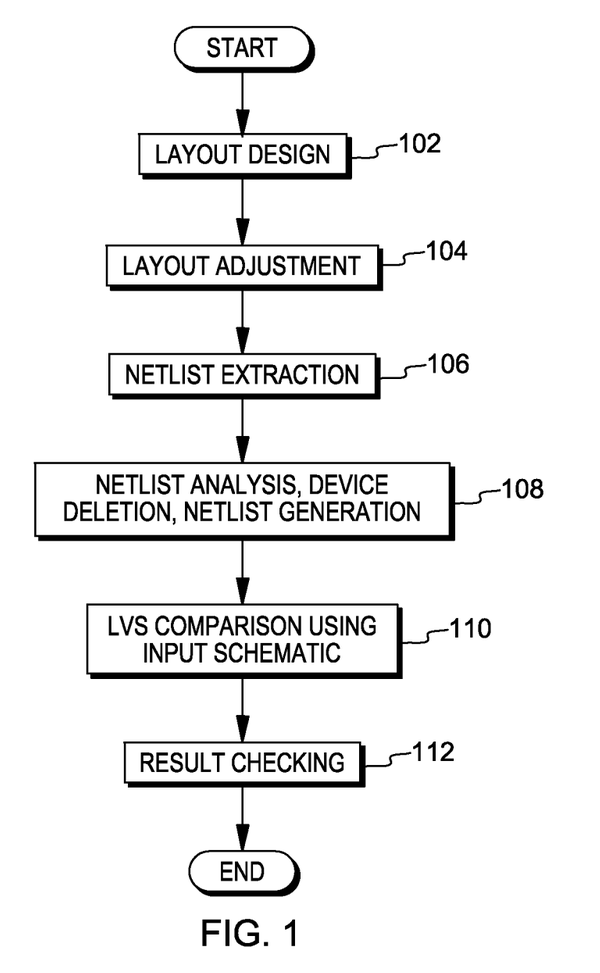
FIG. 1 depicts an overview of a hierarchical Layout Versus Schematic comparison technique using extraneous device elimination in accordance with aspects described herein.

Accordingly, described herein is a methodology for hierarchical LVS comparison for large arrays using extraneous-device based filtering, an overview of which is presented with reference to FIG. 1. Initially, a circuit design layout is drawn (e.g. by a user utilizing an EDA package) (102). The circuit layout is then adjusted (104) in such a way as to facilitate hierarchical netlist extraction and LVS comparison. A hierarchical netlist is then extracted from the adjusted layout (106). The netlist is then processed, in which it is analyzed and extraneous devices are removed to generate a modified hierarchical netlist (108). Removal of the extraneous devices removes the dummy devices from the original layout netlist. In one example, only the active devices of interest are left, and a selection criteria/algorithm can be programmed per the intended definition(s) of dummy device(s). Subsequently, a hierarchical LVS comparison is performed using an input schematic (110), and results are checked (112). An input schematic is a representation of 'the goal' (i.e. correct) circuit design for the circuit. Where there are only a relatively small number of tested devices, the input schematic will be the desired configuration for those tested devices, and will likely contain only those tested devices. Additionally, in some embodiments, device filtering options available in the LVS verification tool are utilized as part of the LVS comparison. This methodology can be used with, for instance, the design of test structures that have relatively small bit cells repeated many thousands or millions of times, in which only a relatively small number of devices require testing.

As noted above, an initial or existing hierarchical circuit design layout is drawn by a user. This existing layout can then be adjusted, producing an adjusted hierarchical layout that facilitates hierarchical netlist extraction. For instance, in an arrayed layout of devices, the hierarchical layout can be drawn as multiple identical single-layout 'blocks', where each block includes a device array, array connections, and all of the layers that define the array devices. Furthermore, the layout can be presented such that the only top-level connections that lead out of a block are electrically connected to the top level pads/ports (collectively referred to herein as "pads").

The adjusted layout yields (by way of extraction discussed below using an EDA package) a theoretical netlist in which each array is represented as a block. An initial layout, before the adjustment, may have one or more of the following characteristics, as examples: (i) randomly instantiated device arrays; (ii) flat devices or arrays at a top level; (iii) connections between a component internal to an array drawn outside of the array; (iv) layers that define devices drawn at a top level as a layer common to more than one array; and/or (v) any other condition which inhibits the extraction of an array as an independent sub-circuit with connections only to top level pads. In one example, the initial layout includes multiple arrays of twenty blocks each, with each block containing millions of devices. According to aspects described herein, an adjusted layout is drawn such that all devices of one block are grouped as a single unit in the netlist. That unit is easy to manipulate using a test program. For instance, devices that are not requiring of testing (extraneous devices) can be 'deleted' from the unit, so that each block will contains only those device that are requiring of testing. The netlist generated from the adjusted layout will contain each of the blocks, and this netlist can be compared to a manual input schematic netlist. The manual input schematic will define desired device properties, such as the particular ports to which each particular transistor connects.

Figure 2:
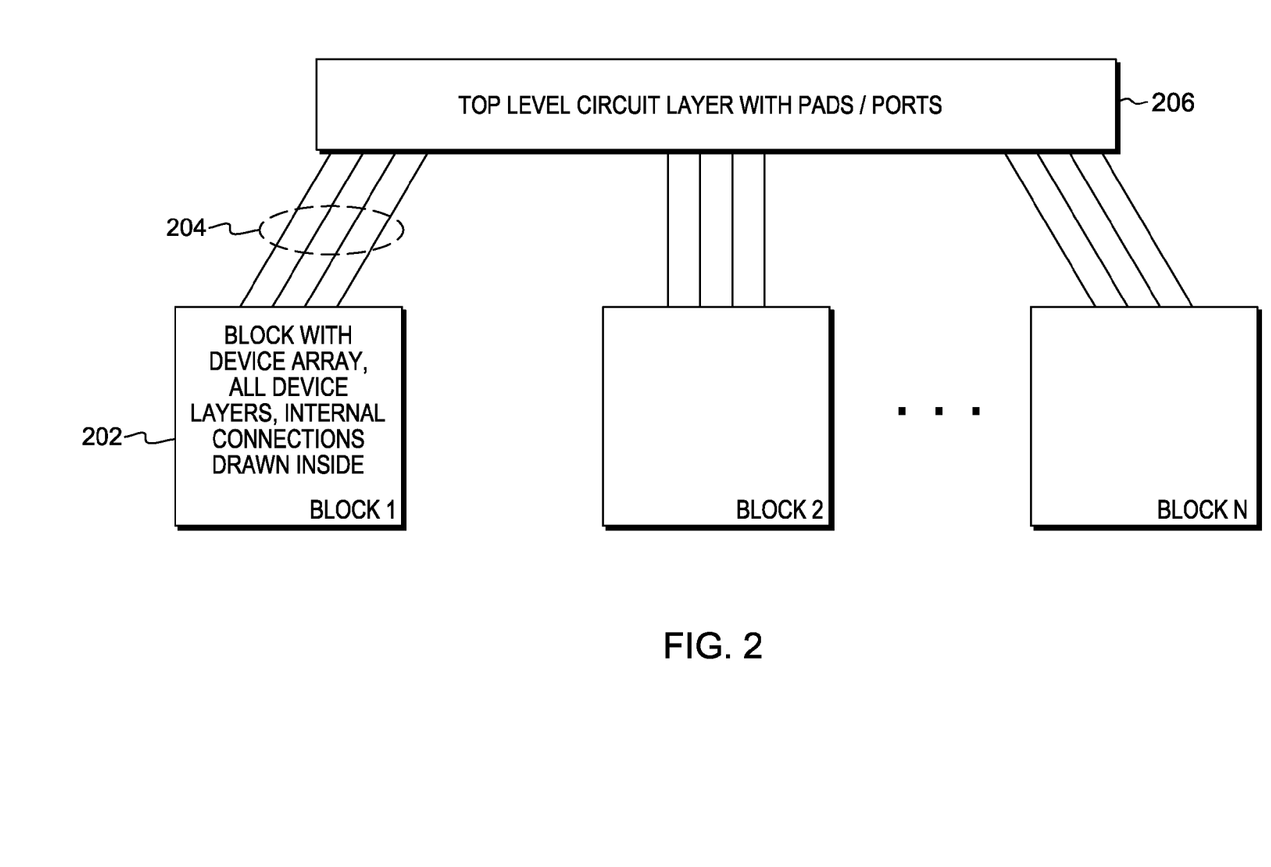
FIG. 2 depicts a conceptual illustration of a hierarchical circuit layout to facilitate hierarchical layout netlist extraction in accordance with aspects described herein.

FIG. 2 depicts a conceptual illustration of an adjusted hierarchical circuit layout to support hierarchical layout netlist extraction in accordance with aspects described herein. In FIG. 2, multiple blocks 202 are provided (in this example N number of blocks). Each block includes a device array and all device layers of the respective array. Additionally, all internal connections (connections between devices within the array) are contained within the block. Further, any connections (204 in FIG. 2) extending outside of a block (i.e. from a component of a block to a component outside of the block) is made to a pad/port at the top level 206 of the hierarchical layout. In some examples, the connection to the pad/port could be made by way of one or more intervening blocks. However, in one example of an adjusted hierarchical circuit layout, no connections exist exclusively between blocks.

Therefore, a block can be connected to more than one pad, a block can be connected to another block, and more than one block can be connected to a same pad, but any top level connection being made cannot exist "inside" the layout hierarchy of a block. The top connection(s) exist outside the block; if these connection(s) exist inside the block, the block is not extracted as a repeated unit in the layout.

Thus, in one embodiment, the adjusted hierarchical layout therefore satisfies the following conditions: (i) all devices, both active and extraneous, of a given array fall within one layout block, and this block is repeated at the top level of the hierarchy as a unit; (ii) each block has all connections internal to the array drawn inside of the block itself; (iii) the only top-level connections permitted to extend outside of the block (from within the block) are connections made to/from a pad/port; (iv) no layer that defines the devices of the array are present outside of the block; and (v) the hierarchy inside of a block does not matter so long as the previous conditions are satisfied.

The above adjustment to the initial hierarchical layout facilitates systematic and hierarchical repetition of 'closed boxes' to achieve large device counts, and allows each block to be read by the EDA extraction tool as a closed box, or a complete sub-circuit in itself. In general, the adjustment draws the layout such that it supports extraction of a block-wise hierarchical netlist.

This adjustment is, in one example, automatically performed by a program of a data processing system configured to accomplish the layout adjustment described above. Alternatively, the adjustment may be performed, in whole or in part, by way of manual modifications made by a user to the layout, utilizing a data processing system.

Figure 3:
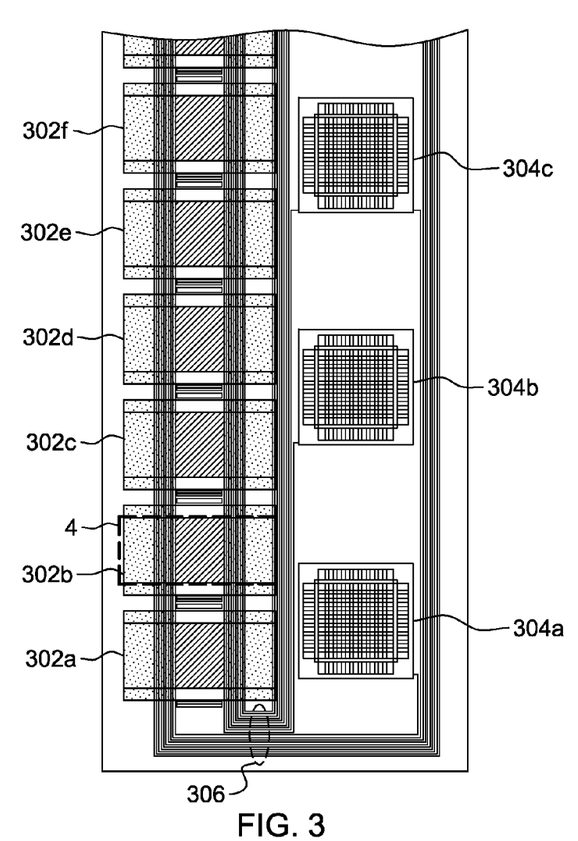
FIGS. 3-5 depict an example circuit layout in which multiple blocks of arrayed devices connect to top level pads in accordance with aspects described herein.

FIGS. 3-5 depict an example adjusted circuit layout in which multiple blocks of arrayed devices connect to top level pads in accordance with aspects described herein. Referring initially to FIG. 3, the adjusted circuit layout includes multiple blocks (302a through 302f) and multiple pads/ports (304a through 304c). Ports/pads 304 represent places where, for instance, a silicon tester can touch and extract a signal. Blocks 302 have top-level connections to pads 304 by way of metal routings 306, which extend to a port/pad 304.

Figure 4:
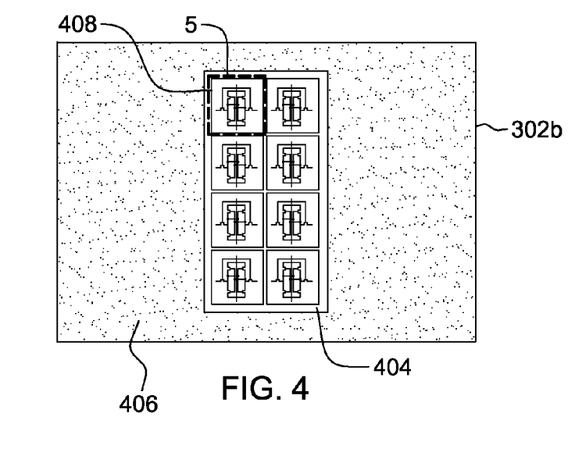

Each block 302 is an array of bit cells (or "unit cells"), and in one example is a very large array with millions of devices. FIG. 4 depicts further detail of block 302b. Referring to FIG. 4, block 302b includes an active device region 404 surrounded by a dummy device region 406. Dummy device region 406 includes no active devices, that is no devices requiring of testing. In one example, dummy devices include a floating/partially-floating devices, devices placed for density fill purposes, or devices that are non-floating but are not electrically significant in the circuit. Active device region 404 includes (in this example) an array of bit cells 408, which are identical and each include both active and extraneous devices. In the example of FIG. 4, the bit cell array of block 302b includes eight such bit cells.

Figure 5:
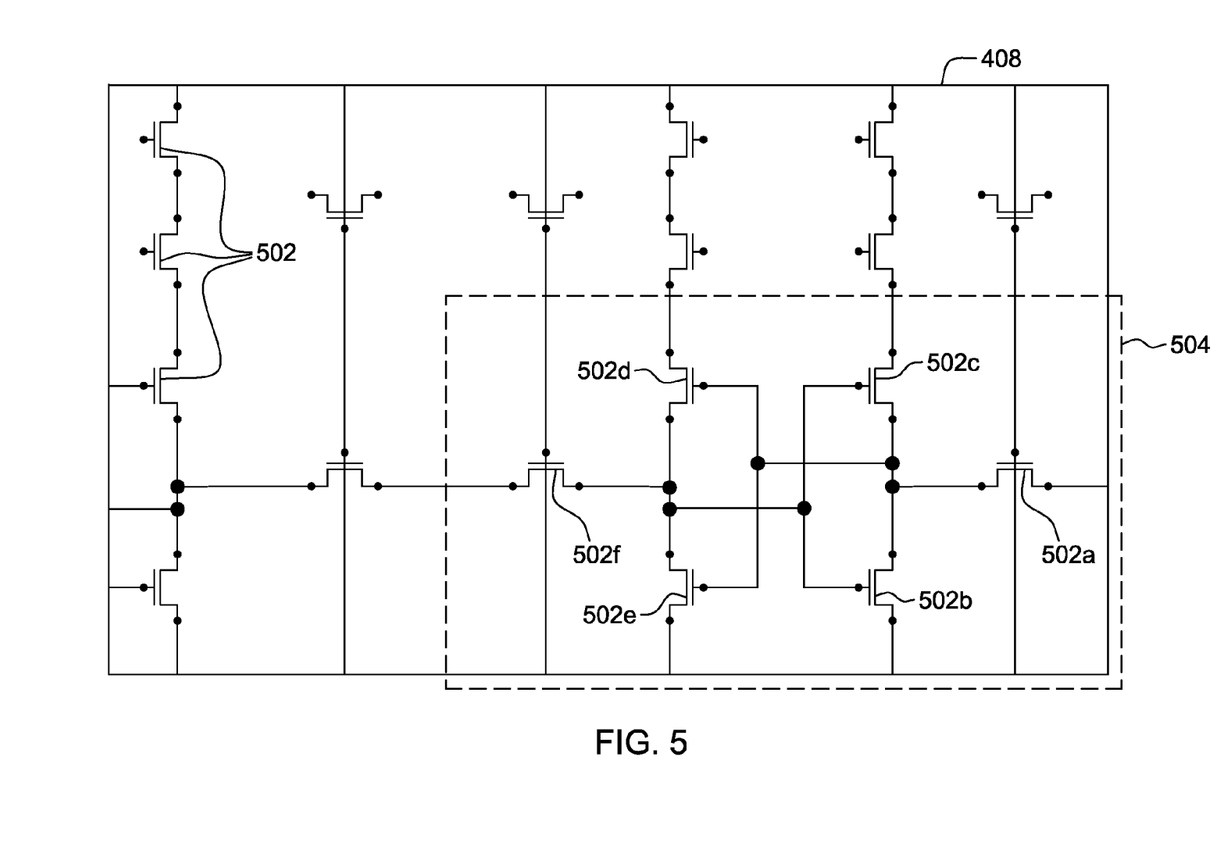

FIG. 5 depicts further detail of bit cell 408. Bit cell 408 includes multiple devices (in this example eighteen transistors 502). In this example, only devices 502a through 502f, denoted within region 504, are required of testing, and therefore are considered the active devices of bit cell 408. The remaining devices of bit cell 408 are, in this example, extraneous devices, based on extraneous device descriptions supplied by a user, in one example, as described below. Thus, instead of verifying all 18 devices, only the six within region 504 are verified, according to aspects disclosed herein.

In the above example, six of the transistors are active devices, while the twelve remaining transistors are extraneous devices. However, it should be understood that such low numbers of devices per bit cell are used only by way of example for illustrative purposes. Some designs can include bit cells having thousands, or possibly millions, of devices out of which only four or five devices are considered active and requiring of verification as part of an LVS comparison. The savings in terms of time and resources used in processing such a layout is therefore significant. In some examples, the number of the removed extraneous devices can range between 100 (or fewer) and 1,000,000 (or greater) times a number of the active devices.

From the adjusted circuit layout as described above, a block-wise hierarchical layout netlist can be extracted using existing techniques and tools, such as existing EDA packages. The extracted netlist includes arrayed devices grouped into blocks repeated at a top level of the hierarchy, as provided in the adjusted hierarchical layout. In one example, control file options of the EDA package specify that the netlist of each block is to be extracted as a separate sub-circuit. In the Calibre® package, for instance, the following options are specified:

LVS BOX 'Block'
LVS PRESERVE BOX CELLS NO
LVS NETLIST BOX CONTENTS YES
FLATTEN INSIDE CELL Block The exact functions and meaning of the above options are specified in the Calibre® package manual.

Figure 6:
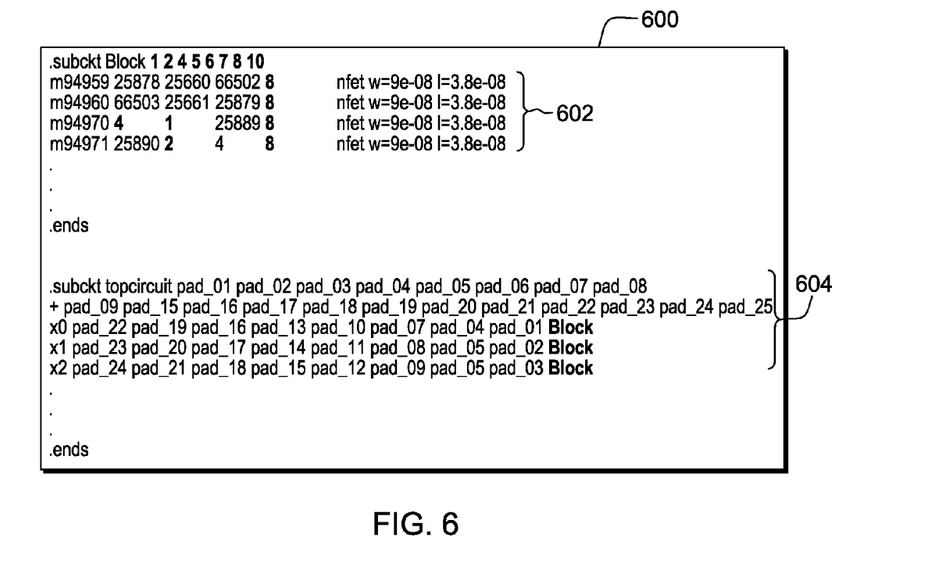
FIG. 6 depicts one example of a hierarchical layout netlist in which arrayed devices are grouped into blocks repeated at a top level of the hierarchy in accordance with aspects described herein.

By the above, a hierarchical layout netlist is extracted from the adjusted hierarchical layout. An example extracted hierarchical layout netlist in which arrayed devices are grouped into blocks repeated at a top level of the hierarchy is depicted in FIG. 6. A portion of netlist 600 is shown, which includes a sub-circuit device definition portion 602 and a device-pad connection definition portion 604. In this example, the device definition format is: [deviceID drain gate source drain], and the netlist defines each block as a separate sub-circuit.

Figure 7:
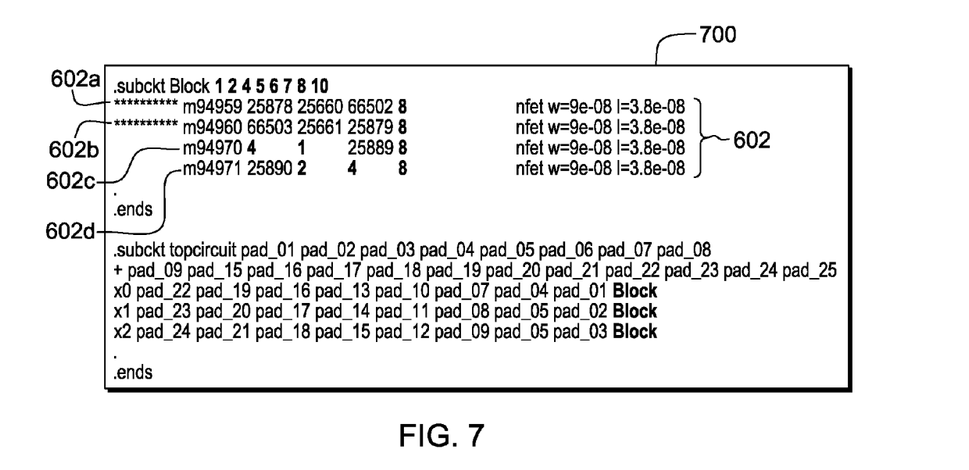
FIG. 7 depicts a modified hierarchical layout netlist, generated from the hierarchical layout netlist of FIG. 6, in which extraneous devices are removed in accordance with aspects described herein.

The generated hierarchical layout netlist is then, in accordance with aspects described herein, used in the generation of a modified hierarchical layout netlist. In the modified hierarchical layout netlist, extraneous devices (from the hierarchical layout netlist) are selectively removed. FIG. 7 depicts an example modified hierarchical layout netlist, in which extraneous devices are removed from the netlist of FIG. 6. For convenience, the netlist of FIG. 6 is termed the sample netlist, and the modified version of the sample netlist is the modified hierarchical layout netlist shown in FIG. 7. According to aspects described herein, the sample netlist is first analyzed to identify extraneous devices. Identification of extraneous devices includes determining whether properties of a device (as specified via the device definition and/or a device-pad connection definition involving the device, as examples) satisfy one of possibly multiple extraneous device descriptions. In one example, the analysis includes comparing device definitions with patterns or masks that specify the properties of what should be considered extraneous devices. The extraneous device descriptions are defined as parameters of a program for performing the analysis. The parameters define properties of extraneous devices, such as (using a transistor as an example) 'gate not connected', 'gate(s) is shorted', or the like.

The program performing the above analysis is, in one example, written in an object-oriented programming language, such as a "C"-based programming language. The program analyzes the sample netlist and identifies which devices are the unused/dummy devices according to the extraneous device descriptions defined with the program. This enables efficient detection of devices that are deemed dummy or unused based on their connection patterns. In one example, an extraneous device description is predefined by a user, and is a custom-created for the circuit design.

Once the extraneous devices are identified, they are selectively removed from the sample netlist to generate the modified hierarchical netlist. In the example of FIG. 7, this removal includes commenting-out device definitions, in which any device having its source or its drain not connected to a top level pad/port is considered extraneous. Thus, in modified netlist 700, devices 602*a* and 602*b* are selectively removed by commenting-out their definitions because those devices do not have their source or drain connected to a top level pad/port, and so are identified as being extraneous. Device definitions 602*c* and 602*d* remain, because these are the active devices of the sample netlist (i.e. either their source or drain is connected to a top level pad/port).

'Removal' of the extraneous devices, in this example, includes rendering the definitions of those devices inoperative by commenting them out. Thus, in this example, the sample netlist is modified by commenting-out some device definitions, and this modified version of the sample netlist is the modified hierarchical netlist depicted in FIG. 7. In other examples, the extraneous device definitions are deleted completely from the sample netlist to form the modified hierarchical netlist. In yet other examples, an entirely new hierarchical netlist is written, based on the sample netlist, in which the contents of the sample netlist that pertain to active devices are carried into the new netlist, while the definitions involving extraneous devices are not carried into the new netlist. This new netlist is saved as the modified hierarchical netlist generated from the sample netlist.

In any case, the selective removal of the extraneous devices results in the generation of a modified hierarchical netlist. The modified hierarchical netlist includes, in one embodiment, only active devices. An LVS comparison can then be performed on the modified netlist, using an input schematic that includes only the active devices of the layout. The LVS comparison produces results that are checked. The results will, in general, indicate whether the generated modified netlist matches the input schematic. Mismatch will indicate that modifications must be made to the original circuit layout, in which case the processes described above (and outlined in FIG. 1) can be repeated until the LVS comparison indicates a match.

Some tools include options that enable some filtering of unused devices as part of the LVS comparison. The Calibre® package, for instance, provides a control file option (LVS FILTER UNUSED OPTION [option] LAYOUT) to filter out other devices. The Calibre® documentation provides a finite set of possibilities for [option] in the above control file statement. These include, but are not limited to:

AE—with source, drain, and gate pins all floating
AF—with source and drain pins tied together
AG—with all pins tied together, including bulk and optional pins
C—with gate tied to power or ground, and either the source or drain floating
K—with neither source nor drain having any path to any pad
P—with no general paths to any pad
Q—with no general paths to any non-power/ground pads
U—with both the source and drain floating In one example, the control file options discussed above and used for netlist extraction are commented-out from the control file, and the above control file option(s) for filtering unused devices is added just prior to performing the LVS comparison. The added option(s) will help filter unused devices, however not all circuit types are supported. Specifically, the available options do not cover every possible definition of an extraneous device, and do not enable users to customize the possibilities of what is considered an extraneous device.

Aspects described herein enable selective removal of extraneous devices as defined by a user, enabling users to customize what kinds of devices are removed from the netlist prior to LVS verification, and providing an efficient manner in which layouts with possibly millions of devices are verified. In some examples, aspects described herein are used in the development of testing devices, such as circuits for measuring parametric process variations in device threshold voltages, saturation currents, Static Random Access Memory noise margins, and so on. In this manner, Static Random Access Memory (SRAM) and/or Dynamic Random Access Memory (DRAM) parametric macro layouts can be verified against equivalent schematics of interest with boosted levels of confidence, circumventing the LVS Comparison tool's limitation in handling a large number of devices.

Figure 8:
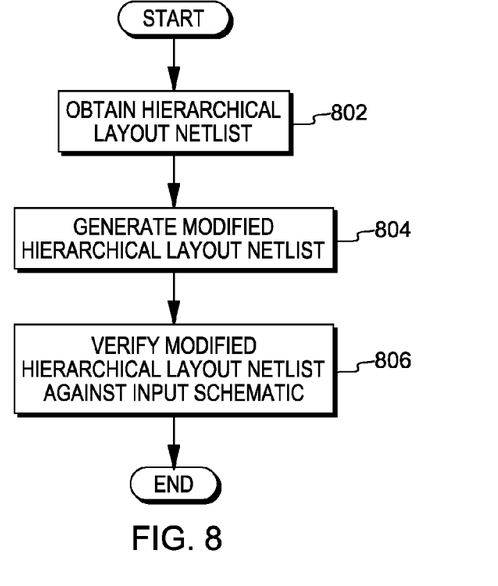
FIG. 8 depicts one example process for facilitating hierarchy-based layout versus schematic verification in accordance with aspects described herein.

Accordingly, a process for facilitating hierarchy-based layout versus schematic verification is provided with reference to FIG. 8. The process begins by obtaining a hierarchical layout netlist (802). In one example, the hierarchical layout netlist groups arrayed devices of a circuit design into a plurality of blocks repeated at a top level of a hierarchy of the hierarchical layout netlist.

Figure 9:
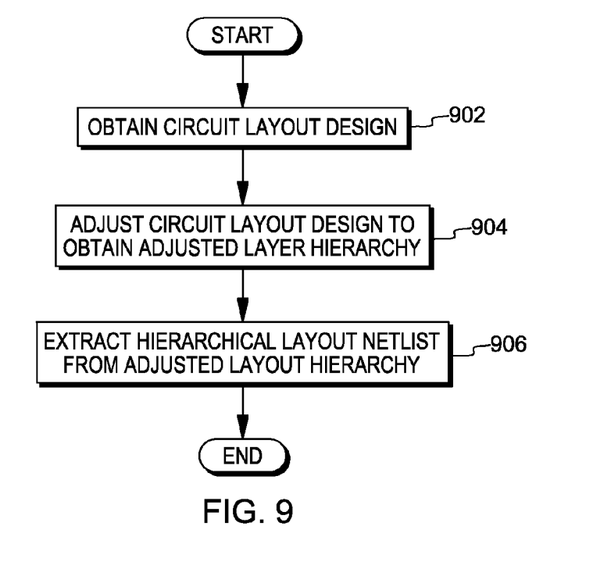
FIG. 9 depicts one example process for obtaining a hierarchical layout netlist in accordance with aspects described herein.

An example process for obtaining a hierarchical layout netlist is described with reference to FIG. 9. Initially, a circuit layout design is obtained (902). Next, the circuit layout design is adjusted to obtain an adjusted layout hierarchy (904). In the adjusted layout hierarchy, arrays of active devices are grouped into separate blocks that have connections to top-level pads of the circuit design. In one particular example, each top level connection of the adjusted layout hierarchy extending from a component of a block of the separate blocks is made to a pad of the circuit design. Finally, the hierarchical layout netlist is extracted from this adjusted layout hierarchy (906). In one embodiment, each connection of the hierarchical layout netlist extending from a component of a block is made to a top-level pad of the circuit design. Additionally or alternatively, the extracted hierarchical layout netlist includes a Simulation Program with Integrated Circuit Emphasis (SPICE) netlist extracted using an Electronic Design Automation package.

Referring back to FIG. 8, once the hierarchical layout netlist has been obtained (802) (e.g. by extracting it from the adjusted layout hierarchy), a modified hierarchical layout netlist is generated (804). In generating the modified hierarchical layout netlist, extraneous devices are selectively removed from the obtained hierarchical layout netlist. The modified hierarchical layout netlist thusly defines active devices and connections thereof to top level pads of the circuit design.

Figure 10:
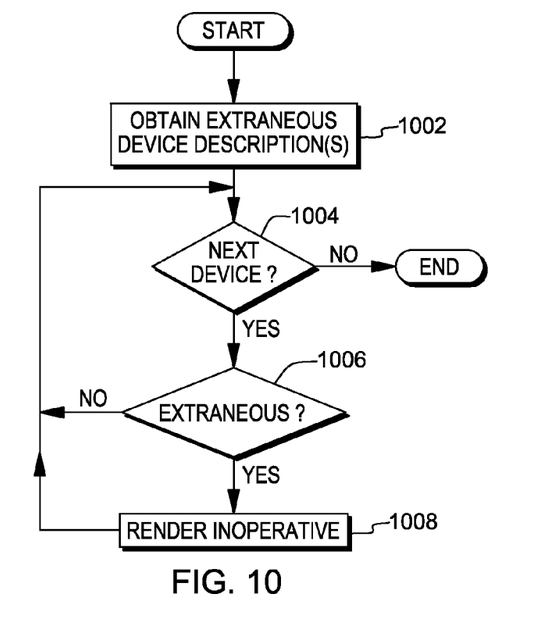
FIG. 10 depicts one example process for generating a modified hierarchical layout netlist in accordance with aspects described herein.

FIG. 10 depicts one example process for generating the modified hierarchical layout netlist. The process begins by obtaining extraneous device description(s) (1002). In one example, these are user-provided customized description(s) of extraneous device(s), customized for the circuit design. Example extraneous devices include floating devices, partially-floating devices, devices placed for density fill purposes, or devices that are not floating but are not electrically significant within the circuit, as examples. Next, the process enters a loop checking, each device and determining whether it is extraneous and should be rendered inoperative. Therefore, at (1004) it is determined whether a next device for checking exists. If not, the process ends. Otherwise, the process determines whether the device is extraneous (1006). That is, it is identified (by way of its definition in the netlist), based on an analysis of the hierarchical layout netlist, as being extraneous (or not) based on properties of the device (more particularly, how the device is defined in the netlist). If the properties satisfy at least one extraneous device description, then the device being defined by that definition is extraneous. Assuming the device is extraneous, then that definition is rendered inoperative (1008). In one particular example, the device definition is rendered inoperative by commenting-out the definition in the sample netlist, which will remove the extraneous device from inclusion in the circuit design. In this manner, extraneous devices are selectively removed from the hierarchical layout netlist to generate the modified hierarchical layout netlist. In some examples, the generating selectively removes every extraneous device from the hierarchical layout netlist.

After rendering an extraneous device definition inoperative (1008), or if instead at (1006) the device is determined not to be extraneous, then the process continues back to (1004).

At the termination of the process of FIG. 10, the modified hierarchical layout netlist has been generated. Referring back to FIG. 8, the modified hierarchical layout netlist is then verified against an input schematic netlist that defines active devices of the circuit design and connections thereof to pads of the circuit design (806). The verifying includes, in one example, performing a layout versus schematic verification between the modified hierarchical layout netlist and the input schematic netlist.

Figure 11:
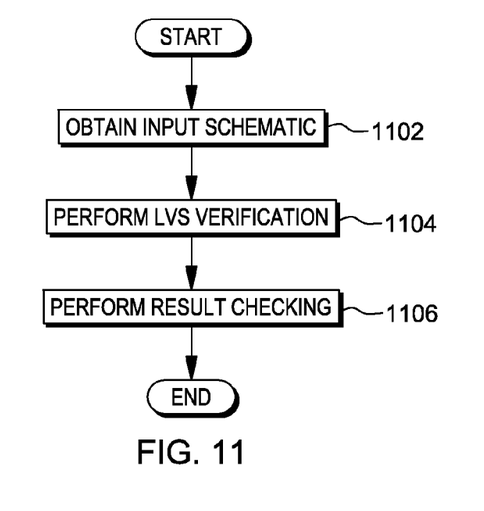
FIG. 11 depicts one example process for verifying a modified hierarchical layout netlist against an input schematic netlist in accordance with aspects described herein.

An example such process for verifying the modified hierarchical layout netlist against an input schematic netlist in accordance with aspects described herein is described with reference to FIG. 11. In one example, this is performed using an Electronic Design Automation package performing a layout versus schematic (LVS) comparison. The process begins by obtaining an input schematic (1102). This is typically defined by user input to a data processing system, wherein a user utilizes a computer program to write the input schematic netlist, supplying it to the LVS verification program. Using the obtained input schematic and the modified hierarchical layout netlist, the LVS program performs LVS verification (1104). Results are generated and result checking is then performed (1106).

Those having ordinary skill in the art will recognize that aspects of the present invention may be embodied in one or more systems, one or more methods and/or one or more computer program products. In some embodiments, aspects of the present invention may be embodied entirely in hardware, entirely in software (for instance in firmware, resident software, micro-code, etc.), or in a combination of software and hardware aspects that may all generally be referred to herein as a "system" and include circuit(s) and/or module(s).

Figure 12:
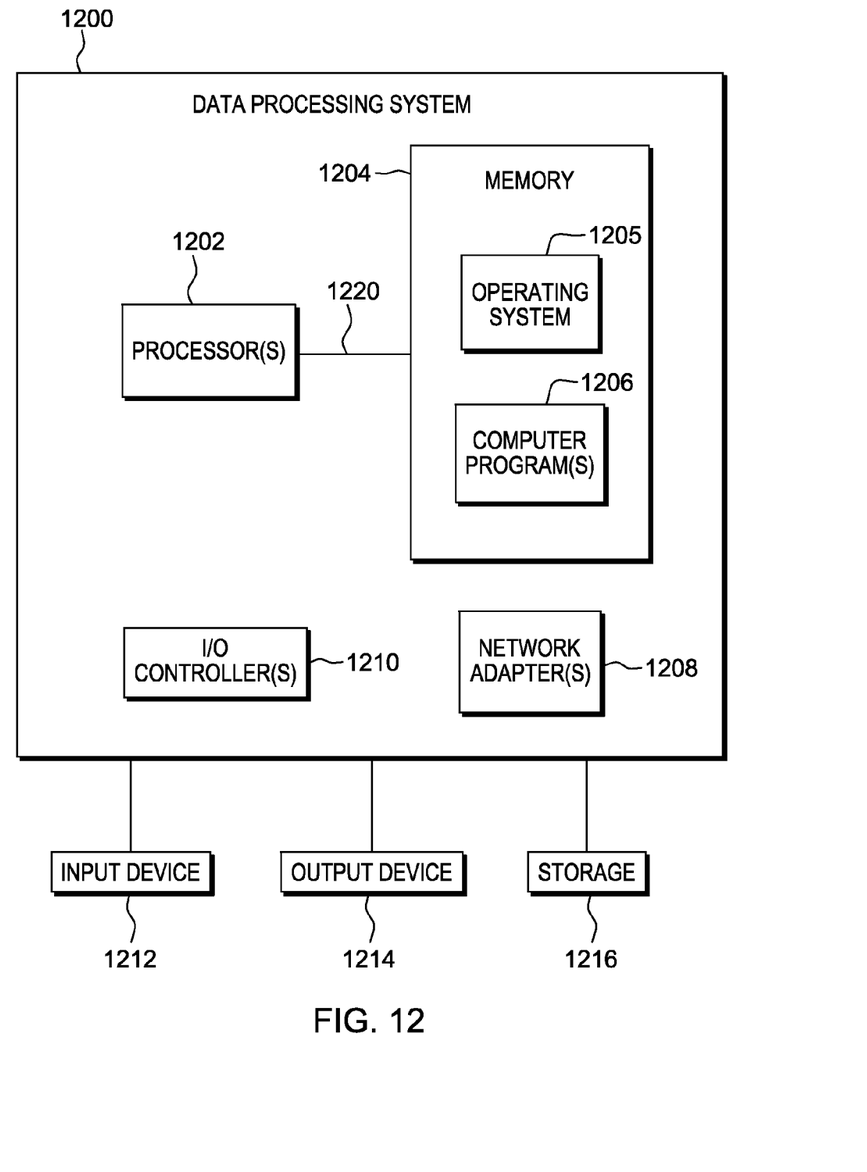
FIG. 12 depicts one example of a data processing system to incorporate and use one or more aspects described herein.

FIG. 12 depicts one example of a data processing system to incorporate and use one or more aspects of the present invention. Data processing system 1200 is suitable for storing and/or executing program code, such as program code for performing processes described above, and includes at least one processor 1202 coupled directly or indirectly to memory 1204 through, a bus 1220. In operation, processor(s) 1202 obtain from memory 1204 one or more instructions for execution by the processors. Memory 1204 may include local memory employed during actual execution of the program code, bulk storage, and cache memories which provide temporary storage of at least some program code in order to reduce the number of times code must be retrieved from bulk storage during program code execution. A non-limiting list of examples of memory 1204 includes a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 1204 includes an operating system 1205 and one or more computer programs 1206, such as one or more Electric Design Automation packages and/or one or more programs for execution to perform aspects described herein.

Input/Output (I/O) devices 1212, 1214 (including but not limited to keyboards, displays, pointing devices, etc.) may be coupled to the system either directly or through I/O controllers 1210.

Network adapters 1208 may also be coupled to the system to enable the data processing system to become coupled to other data processing systems through intervening private or public networks. Modems, cable modem and Ethernet cards are just a few of the currently available types of network adapters 1208. In one example, network adapters 1208 facilitate obtaining data from remote sources to facilitate aspects of the present invention.

Data processing system 1200 may be coupled to storage 1216 (e.g., a non-volatile storage area, such as magnetic disk drives, optical disk drives, a tape drive, etc.), having one or more databases. Storage 1216 may include an internal storage device or an attached or network accessible storage. Computer programs in storage 1216 may be loaded into memory 1204 and executed by a processor 1202.

The data processing system 1200 may include fewer components than illustrated, additional components not illustrated herein, or some combination of the components illustrated and additional components. Data processing system 1200 may include any computing device, such as a mainframe, server, personal computer, workstation, laptop, handheld computer, telephony device, network appliance, virtualization device, storage controller, etc.

In addition, processes described above may be performed by multiple data processing systems 1200, working as part of a clustered computing environment.

In some embodiments, aspects of the present invention may take the form of a computer program product embodied in one or more computer readable medium(s). The one or more computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 13:
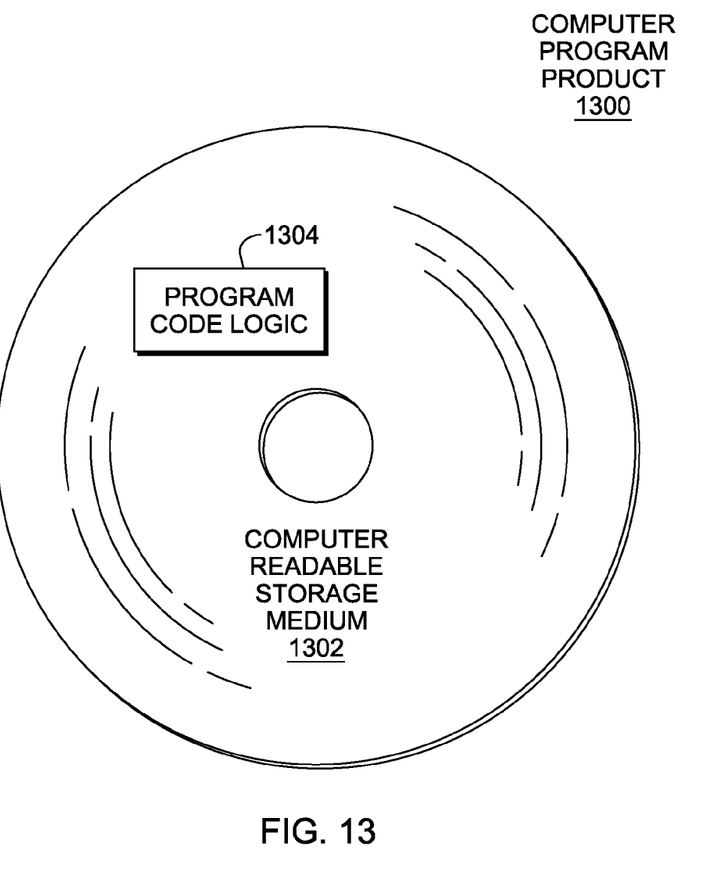
FIG. 13 depicts one embodiment of a computer program product incorporating one or more aspects described herein.

Referring now to FIG. 13, in one example, a computer program product 1300 includes, for instance, one or more computer readable media 1302 to store computer readable program code means or logic 1304 thereon to provide and facilitate one or more aspects of the present invention.

Program code contained or stored in/on a computer readable medium can be obtained and executed by a data processing system (computer, computer system, etc. including a component thereof) and/or other devices to cause the data processing system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present invention may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more data processing system, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects of the present invention. These flowchart illustrations and/or block diagrams could, therefore, be of methods, apparatuses (systems), and/or computer program products according to aspects of the present invention.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneously to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
facilitating hierarchy-based layout versus schematic verification, the facilitating comprising:
obtaining a hierarchical layout netlist for a circuit design, wherein the hierarchical layout netlist groups arrayed devices of the circuit design into a plurality of blocks repeated at a top level of a hierarchy of the hierarchical layout netlist, wherein each connection of the hierarchical layout netlist extending from a component of a block is made to a top level pad of the circuit design, and wherein obtaining the hierarchical layout netlist comprises:
obtaining an existing circuit layout design for the circuit; and
adjusting the obtained existing circuit layout to obtain an adjusted layout hierarchy in which arrays of active devices are grouped into separate blocks having connections to top level pads of the circuit design, wherein each connection of the adjusted layout hierarchy extending from a component of a block of the separate blocks is made to a pad of the circuit design, and wherein the obtained hierarchical layout netlist is extracted from the adjusted layout hierarchy;
generating, by a processor, a modified hierarchical layout netlist defining active devices and connections thereof to the top level pads of the circuit design, the generating comprising selectively removing extraneous devices from the obtained hierarchical layout netlist; and verifying the modified hierarchical layout netlist against an input schematic netlist defining the active devices of the circuit design and connections thereof to the top level pads of the circuit design.

2. The method of claim 1, wherein generating the modified hierarchical layout netlist comprises identifying, based on an analysis of the obtained hierarchical layout netlist, the extraneous devices, wherein a device of the hierarchical layout netlist is identified as being extraneous based on properties of the device satisfying an extraneous device description, and wherein selectively removing the extraneous devices comprises rendering inoperative one or more definitions of the identified extraneous devices in the hierarchical layout netlist to remove the extraneous devices from inclusion in the circuit design.

3. The method of claim 2, wherein rendering inoperative the one or more definitions of the extraneous devices comprises commenting-out the definitions of the extraneous devices in the hierarchical layout netlist.

4. The method of 1, wherein the generating selectively removes every extraneous device from the hierarchical layout netlist to generate the modified hierarchical layout netlist, wherein only active devices are represented in the modified hierarchical layout netlist, and wherein an extraneous device comprises at least one of: a floating device, a partially-floating device, a device placed for density fill purposes, or a device which is not floating but is not electrically significant within the circuit.

5. The method of claim 2, wherein the extraneous device description comprises a user-provided customized description of an extraneous device, customized for the circuit design.

6. The method of claim 1, wherein the verifying comprises performing a layout versus schematic verification between the modified hierarchical layout netlist and the input schematic netlist.

7. The method of claim 6, wherein the extracted hierarchical layout netlist comprises a Simulation Program with Integrated Circuit Emphasis (SPICE) netlist extracted using an Electronic Design Automation package, and wherein the verification is performed using the Electronic Design Automation package.

8. The method of claim 6, wherein the input schematic netlist is defined by user input to a data processing system.

9. The method of claim 1, wherein a number of the removed extraneous devices is between 100 and 1,000,000 times a number of the active devices.

10. The method of claim 1, wherein the circuit design comprises a Random Access Memory parametric macro layout for a circuit for measuring parametric process variations in at least one of device threshold voltages, saturation currents, or Static Random Access Memory noise margins.

11. A computer system comprising:
a storage device comprising program instructions; and
a processor configured to execute the program instructions to perform a method comprising:
facilitating hierarchy-based layout versus schematic verification, the facilitating comprising:
obtaining a hierarchical layout netlist for a circuit design, wherein the hierarchical layout netlist groups arrayed devices of the circuit design into a plurality of blocks repeated at a top level of a hierarchy of the hierarchical layout netlist, wherein each connection of the hierarchical layout netlist extending from a component of a block is made to a top level pad of the circuit design, and wherein obtaining the hierarchical layout netlist comprises:
obtaining an existing circuit layout design for the circuit; and
adjusting the obtained existing circuit layout to obtain an adjusted layout hierarchy in which arrays of active devices are grouped into separate blocks having connections to top level pads of the circuit design, wherein each connection of the adjusted layout hierarchy extending from a component of a block of the separate blocks is made to a pad of the circuit design, and wherein the obtained hierarchical layout netlist is extracted from the adjusted layout hierarchy;
generating a modified hierarchical layout netlist defining active devices and connections thereof to the top level pads of the circuit design, the generating comprising selectively removing extraneous devices from the obtained hierarchical layout netlist; and
verifying the modified hierarchical layout netlist against an input schematic netlist defining the active devices of the circuit design and connections thereof to the top level pads of the circuit design.

12. The computer system of claim 11, wherein generating the modified hierarchical layout netlist comprises identifying, based on an analysis of the obtained hierarchical layout netlist, the extraneous devices, wherein a device of the hierarchical layout netlist is identified as being extraneous based on properties of the device satisfying an extraneous device description, and wherein selectively removing the extraneous devices comprises rendering inoperative one or more definitions of the identified extraneous devices in the hierarchical layout netlist to remove the extraneous devices from inclusion in the circuit design.

13. The computer system of 11, wherein the generating selectively removes every extraneous device from the hierarchical layout netlist to generate the modified hierarchical layout netlist, wherein only active devices are represented in the modified hierarchical layout netlist, and wherein an extraneous device comprises at least one of: a floating device, a partially-floating device, a device placed for density fill purposes, or a device which is not floating but is not electrically significant within the circuit.

14. The computer system of claim 12, wherein the extraneous device description comprises a user-provided customized description of an extraneous device, customized for the circuit design.

15. The computer system of claim 11, wherein the verifying comprises performing a layout versus schematic verification between the modified hierarchical layout netlist and the input schematic netlist, and wherein the input schematic netlist is defined by user input to the computer system.

16. A computer program product comprising:
a tangible storage medium storing program instructions readable by a processor for execution to perform a method comprising:
facilitating hierarchy-based layout versus schematic verification, the facilitating comprising:
obtaining a hierarchical layout netlist for a circuit design, wherein the hierarchical layout netlist groups arrayed devices of the circuit design into a plurality of blocks repeated at a top level of a hierarchy of the hierarchical layout netlist, wherein each connection of the hierarchical layout netlist extending from a component of a block is made to a top level pad of the circuit design, and wherein obtaining the hierarchical layout netlist comprises:

obtaining an existing circuit layout design for the circuit; and adjusting the obtained existing circuit layout to obtain an adjusted layout hierarchy in which arrays of active devices are grouped into separate blocks having connections to top level pads of the circuit design, wherein each connection of the adjusted layout hierarchy extending from a component of a block of the separate blocks is made to a pad of the circuit design, and wherein the obtained hierarchical layout netlist is extracted from the adjusted layout hierarchy;

generating a modified hierarchical layout netlist defining active devices and connections thereof to the top level pads of the circuit design, the generating comprising selectively removing extraneous devices from the obtained hierarchical layout netlist; and verifying the modified hierarchical layout netlist against an input schematic netlist defining the active devices of the circuit design and connections thereof to the top level pads of the circuit design.

\* \* \* \* \*